(12) United States Patent
Zhu et al.

(10) Patent No.: US 7,085,314 B2
(45) Date of Patent: Aug. 1, 2006

(54) METHODS AND APPARATUS FOR REDUCING SIGNAL DEGRADATION

(75) Inventors: Junjie Zhu, Singapore (SG); Hiroki Sugimoto, Singapore (SG); Hideto Ikeda, Singapore (SG)

(73) Assignee: Oki Techno Centre (Singapore) Pte Ltd. (SG)

( * ) Notice: Subject to any disclaimer, the term of this patent is extended or adjusted under 35 U.S.C. 154(b) by 1041 days.

(21) Appl. No.: 09/883,683

(22) Filed: Jun. 18, 2001

(65) Prior Publication Data

US 2002/0039383 A1   Apr. 4, 2002

(30) Foreign Application Priority Data

Jun. 16, 2000   (SG)   .............................. 200003402-5

(51) Int. Cl.
*H03K 11/00*   (2006.01)
*H04L 25/60*   (2006.01)
*H04L 25/64*   (2006.01)

(52) U.S. Cl. ........................... 375/214; 375/211; 455/7

(58) Field of Classification Search ................ 375/214, 375/211
See application file for complete search history.

(56) References Cited

U.S. PATENT DOCUMENTS

| | | | | |
|---|---|---|---|---|
| 4,001,691 A | * | 1/1977 | Gruenberg | 375/214 |
| 4,471,399 A | * | 9/1984 | Udren | 361/64 |
| 4,701,935 A | * | 10/1987 | Namiki | 375/214 |
| 4,789,993 A | | 12/1988 | Ryu | |
| 5,864,579 A | * | 1/1999 | Briskman | 375/130 |
| 6,430,391 B1 | * | 8/2002 | Dent et al. | 455/11.1 |
| 6,697,603 B1 | * | 2/2004 | Lovinggood et al. | 455/13.1 |

FOREIGN PATENT DOCUMENTS

| | | |
|---|---|---|
| EP | 0187672 | 7/1986 |
| GB | 2306082 | 4/1997 |

OTHER PUBLICATIONS

"Orthogonal Frequency Division Multiplexing (OFDM) Explained," by Magis Networks, Inc., 2001.
"Introduction," "The General Problem: Data Transmission Over Multipath Channels," "Single Carrier Approach," "Multi Carrier Approach," "Orthogonal Frequency Division Multiplexing," "An OFDM Receiver for DVB-T," "Tasks of the Inner Receiver and Receiver Structure," "Channel Estimation for OFDM," "Performance of the Complete Receiver," from http://www.ert.rwth-aachen.de/Projekte/Theo/OFDM/node1.html.
"An Introduction to Orthogonal Frequency-Division Multiplexing," by Ove Edfors et al., Sep. 1996.

* cited by examiner

*Primary Examiner*—Jay K. Patel
*Assistant Examiner*—Curtis Odom
(74) *Attorney, Agent, or Firm*—Ostrolenk, Faber, Gerb & Soffen, LLP (57) ABSTRACT

A single frequency relay station receives a signal from a master station, and retransmits it. Before retransmitting the signal, the relay station uses a digital filter to subtract from the signal components which arise from multipath interference and coupling interference. The coefficients used by the digital filter are derived from characteristics of the multipath interference and the overall transfer function of the relay station. These are derived by turning off the retransmission, so that the multipath interference can be estimated from the received signal, and commencing the retransmission again, to determine the transfer function. A simplified inverse fast Fourier transform is used to simplify the calculations.

23 Claims, 6 Drawing Sheets

Figure 13

METHODS AND APPARATUS FOR REDUCING SIGNAL DEGRADATION

FIELD OF THE INVENTION

The present invention relates to methods and devices for reducing noise in a signal received and re-transmitted by a relay station. The invention is particularly suitable if the signal received by the relay station includes multipath interference. The invention further relates to a relay station, such as a single frequency relay station.

BACKGROUND

The ISDB-T (Integrated Services Digital Broadcasting—Terrestrial) BST-OFDM (band segmented transmission—orthogonal frequency division multiplexing) system is an example of what is often called a "single frequency network" (SFN).

In fact, the signal is generally made up of multiple carrier signals. Each carrier has a finite, though narrow, frequency range, and when we talk about the frequency of a single carrier signal, we mean the center frequency of the narrow range. For multi-carrier transmission, such as OFDM in an ISDB-T system, each carrier has a different respective center frequency, and the frequencies are orthogonal to each other. The multi-carrier signal is the sum of the signals of the multiple carriers and is a wideband signal which has a center frequency too. This center frequency is here referred to as the frequency of the signal.

In conventional broadcasting, a signal received by a relay station at one frequency is re-transmitted at another frequency in order to avoid interference. However, by contrast, in digital broadcasting, because of the scarceness of frequency resources, it is usually required that same signal is re-transmitted at the same frequency (i.e. over the same range of frequency) by all transmitters. This is what is meant by the term "single frequency network".

Figure 1:
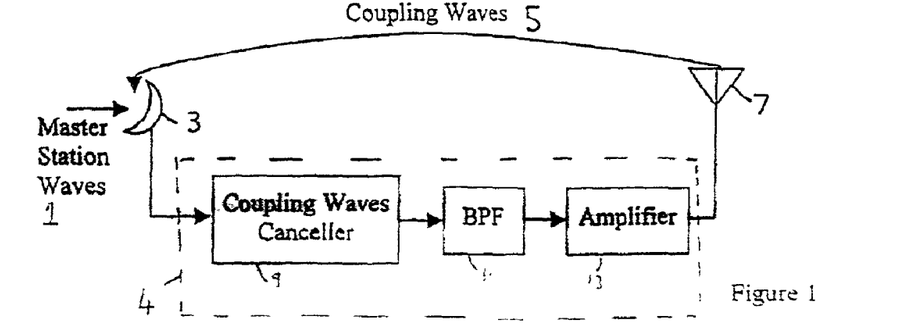
FIG. 1 is a block diagram of a relay station system.

FIG. 1 shows a block diagram of an example of the configuration of a known relay station (also referred to here as a repeater). To relay the terrestrial digital broadcast with SFN, waves 1 received from a master station by an antenna 3 are amplified by a relay broadcasting system 4 and re-transmitted by a second antenna 7 at the same frequency. The waves 1 include a master signal and a level of distortion.

The field strength of the transmitted wave is very intense compared with that of the received wave. Although the receiving antenna 3 is directed to the master station, the transmitting antenna 7 is arranged with a directivity which matches the shape of its service area, and the radio wave is normally radiated at a wider angle. Therefore, coupling waves 5 are received by the receiving antenna 3 at a level which increases with the directivity index of the transmitting antenna 7 to the direction of the receiving antenna 3, or conversely with the directivity index of the receiving antenna 3 to the direction of the transmitting antenna 7. Furthermore, the coupling waves 5 include components of the signal transmitted by the transmitting antenna 7 which reaches the receiving antenna 3 after being reflected by structures, trees and mountains near the relay station. Consequently, the coupling waves 5 are a synthetic signal having a varying delay time, intensity and phase.

A repeater including a cancellation algorithm has been proposed. As shown in FIG. 1, the amplification system 4 of the relay station includes not only an amplifier 13 but also a coupling waves cancellation unit 9 and a BPF (bandpass filter) 11. Note that the apparatus in FIG. 1 is simplified, and in practice often includes additional components such as D/A converter(s).

The coupling waves cancellation unit 9 is conventionally designed based on the assumption that the distortion of the incoming radio waves from the master station is small compared to the master wave itself. However, this assumption is not appropriate for a practical repeater transmission environment which generally has a multipath transmission channel (e.g. there are multiple radio paths between the master station and the relay station, each taking different times). In a multipath channel, the distortion or attenuation of the master wave can be serious at a particular frequency (i.e. over a particular frequency range), especially when the amplitudes of the paths arriving at different time are the same. This is called frequency selective fading. In the presence of deep frequency selective fading caused by such multipath interference, the conventional coupling cancellation unit cannot work well and diverges, because the conventional coupling cancellation unit algorithm does not take the effect of multipath interference into account. Furthermore, it is very difficult for a relay station to distinguish between multipath interference and coupling signals in the received signals. Moreover, for non-coherent modulation, the conventional PSK (phase shift keying) estimation method cannot work well if there is a multipath channel.

Both coupling interference and multipath interference vary with time. Thus, a further advantageous feature of a cancellation unit is that the hardware processing speed should be fast enough to update the adaptive filter of the coupling cancellation unit. The time taken depends on the amount of computation required to perform the updating and the hardware available.

SUMMARY OF THE PRESENT INVENTION

The present invention aims to provide a new and useful method of operating a relay station, and a cancellation circuit for a relay station.

The present invention proposes in general terms that the transmitted signal is interrupted (e.g. by interrupting the connection between the cancellation circuit and the amplifier) so that the multipath interference can be estimated in the absence of coupling. Subsequently, the transmission is resumed, and the digital filter is adjusted to take into account both the multipath interference and the coupling.

Specifically, in a first aspect the invention proposes a method of modifying the values of a plurality of digital filter coefficients for use by a digital filter which is a component of a relay station, the relay station successively receiving a first signal, modifying the first signal using the digital filter to form a second signal, and transmitting the second signal with amplification, said first signal including a master signal subject to an interference and a coupling component derived from the second signal, the method comprising:

(i) interrupting said transmission of the second signal;
(ii) deriving an estimate of said interference and storing the derived interference estimate;
(iii) resuming said transmission of the second signal; and
(iv) modifying said digital filter coefficients using said stored interference estimate and said second signal, to reduce the difference between said second signal and said master signal.

Step (iv) may be repeated iteratively so that the difference between said second signal and said master signal is successively reduced. To monitor the degree to which the relay circuit is successful in reducing the (e.g. multipath) interference, a first parameter of the relay system characterizing the difference between said second signal and said master signal is repeatedly derived. Step (iv) may be repeated until the value of said first parameter traverses a predefined convergence value. Thereafter adjustment of the filter coefficients may be stopped, or optionally further adjustments may be carried out, e.g. to compensate for variations in the coupling component, neglecting the stored interference estimate. This may be adequate while the multipath interference remains approximately constant, but as the multipath interference varies it will become less adequate. Accordingly, a second parameter of the relay station, also characterizing the difference between the second signal and the master signal, may be repeatedly derived, and when the second parameter traverses a predefined divergence value, said steps (i) to (iv) may be repeated. Note that the first and second system parameters may be the same, but in this case the divergence and convergence values are chosen to be different, so that there is a range of values for the system parameter in which steps (i) to (iv) are not being carried out.

Preferably, the relay station modifies the first signal by passing it through a coupling cancellation unit. This has an input receiving the first signal and an output outputting said second signal. The cancellation unit includes the digital filter and a subtracter. The input of the coupling cancellation unit is an input to the subtracter and an output of the subtracter is passed to the output of the cancellation unit and to an input of the digital filter. The subtracter subtracts the output of the digital filter from the received signal.

The relay station further includes an amplifier to amplify the second signal before it is transmitted. A switch may be provided between the cancellation unit and the amplifier, as the means for interrupting the transmission of the second signal.

The step of modifying said digital filter coefficients may be performed, as explained in detail below, by operations in frequency space which produce results which are then converted into time space by a discrete inverse Fourier transform, and then used to modify the coefficients.

To adequately remove multipath interference, the number of digital coefficients (the tap length, M) itself need be no higher than approximately the product of a first value (e.g. 15 µs) representing the maximum delay of the multipath signal and the FFT sampling frequency ($f_S$).

Thus, whereas conventionally the tap weights are found by an interpolation over all the carriers of the signal, the present inventors have recognized that this is inefficient. A much smaller number of virtual carrier can be used. Specifically, the inverse Fourier transform according to the present invention preferably generates a number of time domain points which equal to or a little larger than (e.g. up to twice or three times) the tap length of the digital filter.

To generate this number of output time domain points to sufficient accuracy, the IFFT need only operate on a number of frequency domain points ("virtual carriers") which is of the same order, such as the number of output time domain points multiplied by the ratio of the number of carriers to the FFT size.

This produces a significant improvement in efficiency in relation to the conventional method, and in effect constitutes an independent second aspect of the invention, which is applicable even in cases in which transmission of the second signal is not interrupted as explained above.

According to this second aspect, the invention proposes a method of modifying the values of a plurality of digital filter coefficients for use by a digital filter which is a component of a relay station, the relay station successively receiving a first signal, modifying the first signal using the digital filter to form a second signal, and transmitting the second signal with amplification, said first signal including a master signal subject to an interference having a maximum delay time, each of the digital coefficients of the digital filter modifying the first signal at pairwise time delay intervals $T_p$, the method including:

deriving a discrete Fourier transform of the second signal;

employing said discrete Fourier transform of the transfer function to derive correction values for said digital filter coefficients expressed in the frequency domain; and transforming said correction values into the time domain by an inverse Fourier transform operation, the digital filter coefficients being modified based on the time domain correction values, wherein:

the product of $T_p$ and the number of digital coefficients is substantially equal to the maximum delay time of the interference component of the first signal, and the inverse Fourier transform generates an number of output time domain values equal to or slightly larger than the number of digital coefficients.

In either aspect of the invention, preferably, the master signal is in a format (differential modulation) in which symbols are coded by differences between consecutive segments of the master signal. The adjustment of the digital filter coefficients may then be performed by a process which is based on estimating the differences between consecutive segments of the master signal, i.e. neglecting an estimation of what the master signal was in absolute terms. For example, the master signal may be in a PSK format in which the master signal encodes symbols by phase differences between consecutive segments, and the method may include estimating the differences between the phases of consecutive segments, e.g. rather than trying to estimate the phase of each segment individually. This is particularly useful in determining the transfer function of the relay station.

In fact, this technique constitutes an independent third aspect of the invention, which is a method of modifying the values of a plurality of digital filter coefficients for use by a digital filter which is a component of a relay station, the relay station successively receiving a first signal, modifying the first signal using the digital filter to form a second signal, and transmitting the second signal with amplification, said first signal including a master signal and a coupling component, the master signal being in a format in which symbols are coded by differences between consecutive segments of the master signal, and the coupling component being derived from the second signal, the method comprising:

(i) deriving an estimate of differences between consecutive segments of the master signal;

(ii) deriving an estimated error in said estimation of differences between consecutive segments of the master signal; and (iii) modifying said digital filter coefficients to minimize said estimated error.

The invention also relates to a cancellation unit arranged as discussed above, as well as to a relay station incorporating such a cancellation unit.

BRIEF DESCRIPTION OF THE FIGURES

Embodiments of the invention will now be explained for the purpose of example only, with reference to the following figures, in which.

DETAILED DESCRIPTION OF EMBODIMENTS

Figure 2:
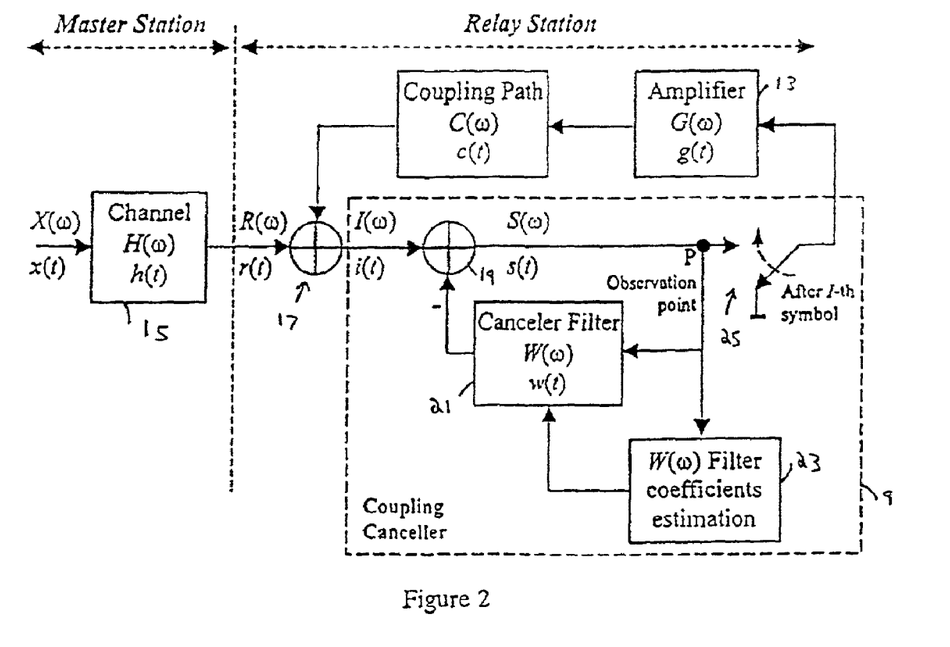
FIG. 2 is a block diagram of a relay station including a coupling cancellation unit according to an embodiment of the invention.

Like the conventional system discussed above, the present embodiment has the general structure illustrated in FIG. 1, but the coupling waves cancellation unit 9 is as illustrated in FIG. 2. The optional BPF 11 of FIG. 1 is omitted from FIG. 2 for simplicity. Likewise, FIG. 2 omits any A/D converter(s) in the system.

FIG. 2 shows the detail of the coupling wave cancellation unit and the principle of canceling coupling waves between the transmitting and receiving antennas of the broadcasting wave relay station. The master signal is x(t) (in the frequency domain X(ω)), which is subject to multipath interference h(t) (H(ω), in the frequency domain, is the multipath channel transfer function), in the channel 15 between the master station and the relay station, to produce a signal r(t) (R(ω) in the frequency domain).

The signal R(ω) from the master station is given by $$R(\omega) = X(\omega) \cdot H(\omega) \quad (1)$$

A coupling wave is added to r(t) (a process represented here by the notional adder 17), to produce the signal received by the antenna 3, here called i(t) (I(ω) in the frequency domain).

A subtracter 19 is used to subtract the coupling signals and multipath interference from the incoming signal i(t) which is one input of the subtracter 19. An adaptive FIR filter 21 is fed the output of the subtracter 19 and connected to the subtracting terminal of the subtracter 19. And a digital signal processing block 23, which estimates the characteristics of coupling path and multipath, is fed the output of the subtracter 19 and provides the FIR filter 21 with updated FIR filter coefficients. Moreover, a switch 25 is inserted between the subtracter 19 and the amplifier 13 to control the relay of the broadcasting signal. When the switch 25 is switched on, connecting the subtracter 19 to the amplifier 13, the signal after cancellation through the subtracter 19 is transmitted through the antenna 7. When the switch 25 is switched off, switching off the connection between the subtracter 19 and the amplifier 13, the output signal of the subtracter 19 is not transmitted and hence there is no coupling wave in the incoming signals.

Supposing the characteristics of coupling wave frequency are C(ω), the gains and frequency characteristics of amplifier at relay station 13 are G(ω). Because the system is studied in baseband, G(ω) may be treated as not including an effect from the antenna or any up/down converter. The signal frequency characteristics at observation point P are written as S(ω), the incoming signal at the relay station receiving antenna 3 is I(ω), expressed by the following equation:

$$I(\omega) = S(\omega) \cdot G(\omega) \cdot C(\omega) + R(\omega) \quad (2)$$

Now supposing that W(ω) is the frequency characteristics of the cancellation unit, $$S(\omega) = I(\omega) - S(\omega) \cdot W(\omega) \quad (3)$$

Substitute equation (2) for (3), and rearrange it as follows:

$$S(\omega) = \frac{R(\omega)}{1 - \{G(\omega) \cdot C(\omega) - W(\omega)\}} \quad (4)$$

By further substituting equation (1) for (4), we express the equation (4) as follows:

$$S(\omega) = \frac{X(\omega) \cdot H(\omega)}{1 - \{G(\omega) \cdot C(\omega) - W(\omega)\}} \quad (5)$$

Consequently, transmission function F(ω) of whole the system is expressed with the following equation:

$$F(\omega) = \frac{S(\omega)}{X(\omega)} = \frac{H(\omega)}{1 - \{G(\omega) \cdot C(\omega) - W(\omega)\}} \quad (6)$$

Using this formalism, we can analyse the behaviour of the conventional method of canceling coupling waves discussed above. In the conventional method it is assumed that the distortion of the incoming radio waves from the master station is small enough. That means that H(ω)≅1. Then the system transfer function can be written as $$F(\omega) = \frac{1}{1 - \{G(\omega) \cdot C(\omega) - W(\omega)\}} \quad (7)$$

In this case, to cancel the coupling waves, G(ω)·C(ω)=W(ω) is required. In other words, the optimal FIR filter transfer function is $W_{opt}(\omega) = G(\omega) \cdot C(\omega)$. Now setting the tap-weight estimation error at the i+1-th iteration is $$Er(\omega) = W_{opt}(\omega) - W_{i+1}(\omega) \quad (8)$$

where $W_{i+1}(\omega)=W_i(\omega)+\Delta W_{i+1}(\omega)$ is the updating tap-weight vector at i-th iteration. Obviously, if the change in the tap-weight vector at i-th iteration $\Delta W_{i+1}(\omega) \cong Er(\omega)$ and $Er(\omega)$ is controlled to the minimum, coupling can be cancelled. It is expressed by the following equation, which can also be derived using the NLMS (Normalized Least Mean Square) algorithm (see Simon Haykin, "Adaptive Filter Theory", Third edition, 1996):

$$\Delta W_{i+1}(\omega) = 1 - \frac{1}{F(\omega)} = 1 - \frac{X(\omega)}{S(\omega)} \qquad (9)$$

By introducing a scaling factor $\mu$, we may write $$W_{i+1}(\omega)=W_i(\omega)+\mu \cdot \Delta W_{i+1}(\omega) \qquad (10)$$

This method is limited to the characteristics of multipath channel. We note that in Equation (9), $F(\omega)$ should not be very small, or the cancellation unit will become very unstable and hence diverge. From Equation (6), we know that $F(\omega)$ is a function of multipath channel, $H(\omega)$. In multipath channel, when the attenuation difference between two main paths is not very large (that is, "$DU_m$", defined as the power ratio of the first path to the second path, is small) there is a deep fading at some frequency and $H(\omega)$ at that frequency will be very small. Therefore, it is possible that the value of $F(\omega)$ at some frequency is very small if $H(\omega)$ is small.

Let us now compare this with the algorithm proposed by the present invention. To do this we analyse FIG. 2 again in the context of the present invention. As we know, the target of the coupling cancellation unit 9 is to cancel the coupling waves and the effect of multipath channel and hence recover the original signal from master station. That is, the output of coupling cancellation unit 9, $S(\omega)$, will converge to be almost equal to master station output, $X(\omega)$, i.e.

$$F(\omega) \cong 1 \qquad (11)$$

To hold this condition, the optimal FIR filter transfer function is developed as following, $$W_{opt}(\omega)=G(\omega) \cdot C(\omega)+H(\omega)-1 \qquad (12)$$

Using Equation (6) and (12) in (8), we may reformulate the estimation error $Er(\omega)$ as $$Er(\omega) = G(\omega) \cdot C(\omega) + H(\omega) - 1 - \Delta W_{i+1}(\omega) - W_i(\omega) \qquad (13)$$
$$= H(\omega)\left(1 - \frac{1}{F(\omega)}\right) - \Delta W_{i+1}(\omega)$$

If $Er(\omega)$ is controlled to the minimum, coupling can be cancelled. Then we hope that $\Delta W_{i+1}(\omega)$ is minimized, which is subject to the constraint $$Er(\omega)=0 \qquad (14)$$

Then Equation (13) is converted as follows:

$$\Delta W_{i+1}(\omega) \cong H(\omega)\left(1 - \frac{1}{F(\omega)}\right) \qquad (15)$$

This result is a little different from that of conventional method in which the multipath channel effect, $H(\omega)$, is not considered. Now let's see what will happen if $H(\omega)$ is ignored.

$$\Delta W_{i+1}(\omega) = 1 - \frac{1}{F(\omega)} = 1 - \frac{X(\omega)}{S(\omega)} \qquad (16)$$
$$\cong \frac{H(\omega) + G(\omega) \cdot C(\omega) - 1 - W(\omega)}{H(\omega)}$$

From the equation (16), we know that when $W(\omega)$ approaches $W_{opt}(\omega)$, $\Delta W_{i+1}(\omega)$ approaches zero. In this case, the multipath channel, $H(\omega)$, has little influence on $\Delta W_{i+1}(\omega)$. Now it can be concluded that in multipath channel when $H(\omega)$ approaches 1, the coupling cancellation unit 9 can work perfectly; but when the channel has large frequency selective fading, the cancellation unit 9 may be very unstable.

From Equation (15), we know that if we can estimate the multipath channel information, we can apply the channel function $H(\omega)$ to cancellation unit 9 and improve the system performance. However, it is very difficult to implement the equation (15) directly. Since for repeater the received signal includes not only the coupling wave but also the multipath interference, it is almost impossible to distinguish the two factors and extract $H(\omega)$. Therefore, the problem is how to obtain the multipath channel information.

The embodiment of the present invention is operated by switching off the switch 25 to stop the connection of the coupling cancellation unit 9 and the amplifier 13 in FIG. 2. Thus, there is no signal re-transmitted at the relay station and hence no coupling waves in the incoming signals at the relay station. The estimation of multipath channel can be processed.

The new proposed method is called Channel Pre-estimation (CPE): we control the repeater not to transmit signal until the multipath channel is estimated. In the repeater environment, it is usually assumed that the transmission channel is stationary for a long time and there exists a line-of-sight (LOS) from the master station antenna to the relay station antenna. This implies that multipath $DU_m$ is larger than zero and the channel $H(\omega)$ is constant for a long time within which cancellation unit can converge completely. At the beginning, the repeater doesn't retransmit the signal from the master station. Since at this moment there is no coupling, the repeater can estimate the multipath channel information, $H(\omega)$. The required duration of time to stop transmission to estimated multipath channel information is only several milliseconds. After starting to repeat the incoming signal, the coupling cancellation unit can use $H(\omega)$ to compute the tap-weight $W(\omega)$ with Equation (15).

Figure 3:
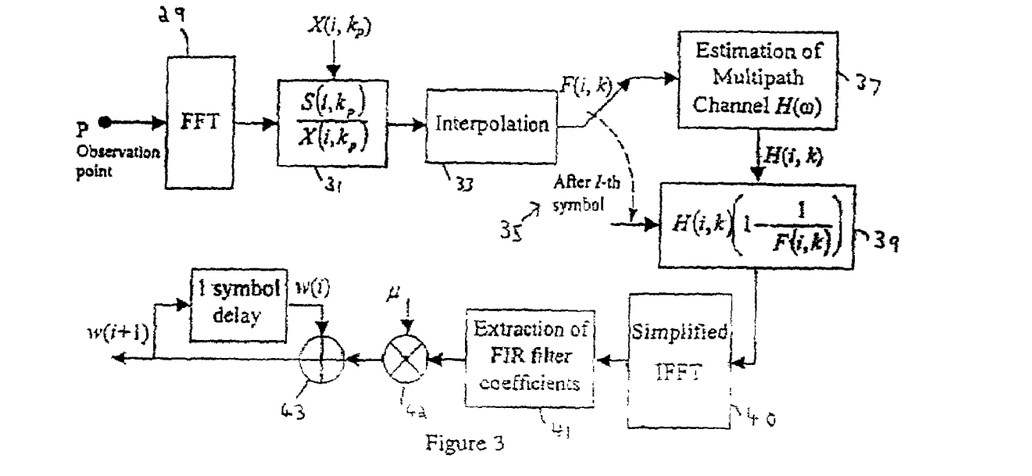
FIG. 3 is a block diagram of using digital signal processing to estimate FIR filter coefficients in the arrangement of FIG. 2.

The digital signal processing block to implement the CPE method is shown in detail schematically in FIG. 3, wherein the incoming signals (at point P) are transformed into frequency domain using a FFT (step 29). For QAM modulation, for example, the signals over pilot carriers are extracted (step 31) for estimation (by interpolation in step 33) of the channel transfer function (CTF) F. There is a switch 35 connecting the interpolated CTF to the multipath channel estimation or the FIR filter coefficients updating estimation. The operation of the switch 35 in FIG. 3 corresponds to that of the switch 25 in FIG. 2. When output of interpolation block 33 is connected to multipath channel estimation block 37, the multipath channel estimation is processed and multipath channel information $H(\omega)$ is stored. When the output of interpolation block 33 is connected to the filter coefficients update estimation block 39 which is also fed with the estimated multipath channel information, the FIR filter coefficients update estimation is processed. Then the updates to the filter coefficients are transformed into time domain using IFFT (step 40) and a correction value is extracted (step 41), multiplied by a coefficient (step 42), to produce a correction value which is used for correcting the FIR filter values (step 43).

Thus, the method of canceling coupling waves includes the steps of:

a) switch off the connection 25 of the coupling cancellation unit 9 and the amplifier 13 to make sure that there is no signal relayed from the repeater;

b) when there is no signal repeated, estimate the multipath channel $H(\omega)$ and store the estimated channel information;

c) Switch on the connection 25 of the coupling cancellation unit 9 and the amplifier 13 to allow the output signals of the coupling cancellation unit 9 to be relayed;

d) apply the estimated multipath channel information to estimate the FIR filter coefficients;

e) Update the FIR filter coefficients;

Rather than a switch 25, the relay station may employ any other mechanism to disable the amplifier from transmitting an amplified signal to the antenna 7 while the filter coefficients are being tested.

The steps of estimation of FIR filter coefficients can be repeated at any time. We may arrange a device to measure some parameter, e.g. Signal-to-Noise (SNR) of the coupling cancellation unit output or mean square error of FIR filter coefficients. If the parameter rises to a divergence threshold, e.g. because the multipath channel has changed since the FIR coefficients were last derived, this indicates that the coupling cancellation unit 9 may diverge. In this case, the repeater stops retransmission, estimates the multipath channel again, and makes the cancellation unit 9 adapt to the channel and converge to the required extent.

As we know, after convergence when $W(\omega)$ approaches $W_{opt}(\omega)$, $\Delta W_{i+1}(\omega)$ approaches zero. At this moment, the multipath channel, $H(\omega)$, has little influence on the estimation of $\Delta W_{i+1}(\omega)$. Then, the estimation of multipath information is not needed and a function for the channel information, $H(\omega)$, can be assumed, e.g. it can be assumed to be one.

A convergence threshold of some system parameter (e.g. the same parameter which triggers the recalibration process by reaching the divergence threshold) is used to distinguish whether the coupling cancellation unit 9 has yet reached this state of convergence. When the value of the measured parameter of the coupling cancellation unit 9 reaches the required threshold, the operation discussed above (i.e. neglecting further estimates of $H(\omega)$) can be executed. Note that the value of the convergence threshold may be different from that of the divergence threshold.

From Equation (15), we can see that if a judged value of the pilot signal or received signal is used to determine $X(\omega)$ by measuring the frequency characteristics $S(\omega)$ of the signal at the observation point P, the coupling and multipath interference can be cancelled. In ISDB-T systems, several modulations are used, π/4 Shift DQPSK, QPSK, 16QAM and 64QAM. For non-coherent and coherent modulation, the methods of estimating $X(\omega)$ used in the present invention could be different. We will now discuss these methods in detail for the cases of differential modulation, and modulation with scattered pilot signals.

1. Differential Modulation

Figure 4:
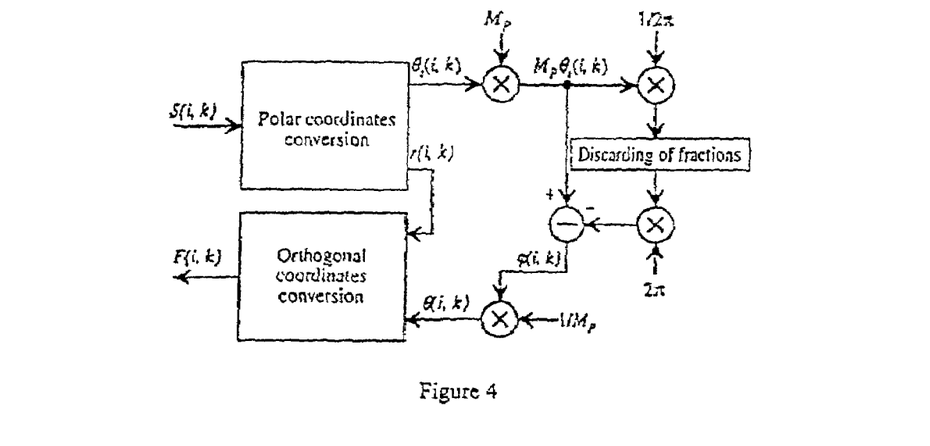
FIG. 4 illustrates a method for calculating the transfer function for PSK-OFDM.

For differential modulation such as π/4 Shift DQPSK, the desired signal, $X(\omega)$, can be estimated using conventional PSK estimation method as shown in FIG. 4.

The phase and amplitude for the k-th carrier of i-th received symbol can be obtained from Equation (17) and (18).

$$\theta_s(i, k) = \tan^{-1} \frac{SQ(i, k)}{SI(i, k)} \qquad (17)$$

$$r(i, k) = \sqrt{SI^2(i,k) + SQ^2(i,k)} \qquad (18)$$

Here SI and SQ are defined as the quadrature components of S, i.e. the real and imaginary parts of the complex signal S respectively. The phase difference between the received signal and the estimated desired signal is given by $$\theta(i, k) = \theta_s(i, k) - \frac{2\pi}{M_P} \cdot RND\left[\frac{M_P \cdot \theta_s(i, k)}{2\pi}\right] \qquad (19)$$

where RND[X] rounds the elements of X to the nearest integers. The amplitude of desired signal as unit one. Then system transfer function defined by Equation (6) is written as $$F(i,k) = r(i,k)\exp(j\theta(i,k)) \qquad (20)$$

As we know, the positions of π/4-DQPSK signals in the complex coordinates alternate between constellation $P_{odd} = \{-3\pi/4, 3\pi/4, -\pi/4, \pi/4\}$ and $P_{even} = \{0, \pi, \pi/2, -\pi/2\}$. In practical systems, the receiver doesn't know which constellation the received signal belongs to. Therefore, an eight-point constellation should be used in PSK-estimation, i.e. $M_p = 8$ in Equation (19). This results in higher estimation error probability and deteriorates system performance.

Here, we just consider the phase difference between the consecutive DQPSK-OFDM symbols, $$\Delta\theta(i+1,k) = \theta_s(i+1,k) - \theta_s(i,k) \qquad (21)$$

Because the original DQPSK data and its demodulation are related to the phase difference only, we do not have to estimate the phase of every received symbol like in PSK estimation method. Then we may estimate the desired differential phase, $\Delta\hat{\theta}(i+1,k)$, by using the same algorithm as PSK estimation for individual symbol phase, $$\Delta\hat{\theta}(i+1, k) = \frac{2\pi}{M_P} \cdot RND\left[\frac{M_P \cdot \Delta\theta(i+1, k)}{2\pi}\right] \qquad (22)$$

In order to recover the original data, we consider the estimation error of the is phase difference, $$\Delta\theta_e(i+1, k) = \Delta\theta(i+1, k) - \Delta\hat{\theta}(i+1, k) \qquad (23)$$
$$= (\Delta\theta(i+1, k) + \theta_s(i, k)) - (\Delta\hat{\theta}(i+1, k) + \theta_s(i, k))$$
$$= \theta_s(i+1, k) - (\Delta\hat{\theta}(i+1, k) + \theta_s(i, k))$$

We define the amplitude of DQPSK signal is unit one and the phase of the estimated desired signal is $$\hat{\theta}_X(i+1,k)=\theta(i,k)+\Delta\hat{\theta}(i+1,k) \qquad (24)$$

then the estimated desired signal is written as $$\hat{X}(i+1,k)=\exp(\hat{\theta}_X(i+1,k))=\exp(\theta(i,k)+\Delta\hat{\theta}(i+1,k)) \qquad (25)$$

Substitute Equation (24) into (23), $$\Delta\theta_e(i+1,k)=\theta_s(i+1,k)-\hat{\theta}_X(i+1,k) \qquad (26)$$

Therefore, the target of differential modulation coupling cancellation unit is to make $\Delta\theta_e(i+1,k)$ to the minimum. This method can be implemented by replacing $\theta_s(i,k)$ and $\theta(i,k)$ with $\Delta\theta(i+1,k)$ and $\Delta\theta_e(i+1,k)$ in FIG. 4.

Note that the estimated desired signal may not be equal to the original signal which is transmitted by master station and distorted by multipath channel. The system transfer function is represented as $$\begin{aligned}
F(i,k) &= \frac{S(i,k)}{X(i,k)} \qquad (27)\\
&= r(i,k)\exp(j(\theta_S(i,k)-\theta_X(i,k)))\\
&= r(i,k)\exp\left[j(\theta_S(i,k)-\hat{\theta}_X(i,k))\right]\cdot\\
&\quad \exp\left[j(\hat{\theta}_X(i,k)-\theta_X(i,k))\right]\\
&= r(i,k)\exp(j\Delta\theta_e(i,k))\cdot\exp\left[j(\hat{\theta}_X(i,k)-\theta_X(i,k))\right]\\
&= \frac{S(i,k)}{\hat{X}(i,k)}\cdot\exp\left[j(\hat{\theta}_X(i,k)-\theta_X(i,k))\right]
\end{aligned}$$

Obviously, it is impossible to calculate $F(i,k)$, since we do not know the original signal phase, $\theta_X(i,k)$. However, we can still use $$F'(i,k) = \frac{S(i,k)}{\hat{X}(i,k)}$$

by replacing $F(i,k)$ in Equation (15).

This method is better than the conventional method. Because in a multipath channel, the transmitted signal can be seriously distorted, the error probability of the PSK estimation of desired signal would be large especially at $M_p=8$. But assuming the multipath channel is quasi-static during two symbols, there is little influence on the phase difference between the consecutive symbols. Another advantage is that the phase difference between consecutive $\pi/4$-DQPSK signals is always from a four-point constellation $P=\{-3\pi/4, 3\pi/4, -\pi/4, \pi/4\}$. In this case, the minimum distance between the pairs of signal points is enlarged, i.e. $M_p=4$. Therefore, the differential PSK estimation is more reliable than the PSK estimation.

However, in a worse multipath channel, neither PSK nor DQPSK estimation can really realize the transmitted signal due to lack of the knowledge of the real initial phase of the transmitted signal. Therefore, the ability to equalize or is cancel the multipath interference for the cancellation unit is limited by the depth of multipath fading. If the initial phase of the transmitted signal is required, a training sequence for estimation of the initial phase should be inserted before transmitted data.

2. QAM Modulation with Scattered Pilot Symbols

Figure 5:
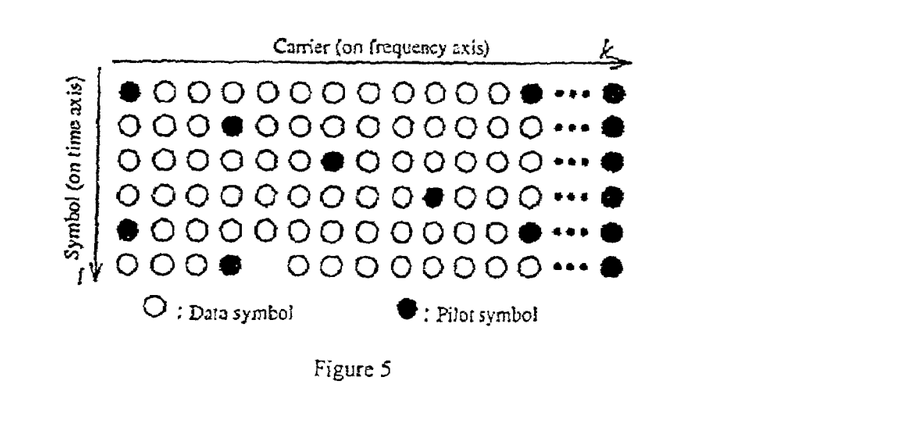
FIG. 5 shows the layout of a pilot signal.

In ISDB-T systems, for coherent modulation segments, the SP (Scattered Pilot) signals (i.e. data symbols with an amplitude value known at the receiver) are transmitted together with data carriers, so that the channel transfer function (CTF) is estimated both in frequency and in time. FIG. 5 shows the scattering pattern of pilot carriers distributed in the direction of OFDM symbol and carrier. According to the OFDM transmission system, pilot and data are regarded as signals under the frequency domain. Transmission is made after making IFFT on the modulation side and FFT on the demodulation side. Since the transmission signal $X(i,k)$ is known in the pilot signal section, the samples of the CTF, $F(i,k)$ can be easily obtained by dividing the received pilot signals by the known pilots. The channel estimation over all carriers is performed by interpolation of the CTF samples. The interpolation processing is made using two-dimensional filters after estimating the pilot signal as a reference.

After obtaining $\Delta W_{i+1}(\omega)$, IFFT and coefficients extraction is performed $$\Delta w(i)=\text{Coefficients-Extraction}\{\text{IFFT}[\Delta W_{i+1}(\omega)]\} \qquad (28)$$

where $\Delta w(i)$ is a (M×1) vector, and M is tap length of the FIR filter. Since there is a FFT sample delay between the input and output of FIR filter, $\Delta w(i)$ coefficients are extracted from the second samples to the following M+1 samples after IFFT. Finally, we get $$w(i+1)=w(i)+\mu\Delta w(i) \qquad (29)$$

The IFFT used in any of methods according to the present invention discussed above may be a conventional IFFT algorithm, examples of which are well-known in this field. However, we will now explain why it is possible to improve on the efficiency of such a strategy.

In the coupling wave canceller, an adaptive filter characterizing the coupling path and multipath channel is used. Two important parameters of the adaptive filter are tap length M and tap interval $T_p$. The tap length is the number of taps in the filter. The tap interval refers to the delay time between the consecutive taps of the filter. The two parameters determine how long a delay time of the multipath signal or coupling signal the filter can accommodate. In other words, the tap length should be longer than the maximum delay time.

In a repeater environment, for example, the maximum delay time of the multipath channel is normally up to about 15 µs. To cope with such a multipath channel, $M \cdot T_p$ should be larger than 15 µs. Because FFT (2048) sampling frequency $f_S$ in ISDB-T is 8.12693 . . . MHz, the sampling interval $T_C=1/f_S$ and the FIR filter tap interval should be $T_C$ too. Thus, $M > 15$ µs/$T_C$ and tap length is set to 128.

The adaptive filter coefficients are generated through a series of computation over frequency domain and transforming the computation results into time domain using IFFT. As we know, the IFFT output sample point number is a number of the n-th power of 2. It could be very large when its input point number very large. When the output IFFT size is 2048 points, only the first 128 IFFT output samples out of 2048 need to extracted for use as the filter coefficients.

Now let us consider the conventional technique of making use of all of the IFFT output points for the filter coefficients. Then the tap length is equal to the IFFT size 2048. Using the example above, such an adaptive filter can adapt to a multipath delay time of 2048$T_C$=252 µs long. This is surplus to requirements, because the multipath signals received after 15 μs are insignificant, and can be ignored. In other words, we do not need to compute an IFFT with a size up to the conventional value 2048. It is enough to use a filter with 128 taps to obtain only previous 15 μs channel information. Therefore, we may reduce the IFFT size to a value equal or a little larger than the tap length.

Theoretically, it is possible to exactly reconstruct a band-limited function if the sample interval $t_S$ is smaller than $\frac{1}{2}f_S$, where $f_S$ is the frequency limit of the function, but ideal interpolation must be used. In ISDB-T channel estimation, since the interpolation is done in the frequency domain, the sample interval for the interpolation of the sampled CTF is the spacing between the pilot carriers, $\Delta f$, while the frequency limit is the coherent bandwidth of the channel $B_C$. In all practical channels the coherence bandwidth of the channel $B_C$ is larger than the pilot spacing $\Delta f$ thus the CTF may be considered as oversampled and can be restored over all carriers. Furthermore, the channel impulse response can be obtained after the IFFT transform of the interpolated CTF.

In the coupling cancellation unit 9, the tap coefficients of the FIR filter are extracted from the IFFT transform of the estimated CTF. The filter tap-length is determined by the delay time of the coupling waves which is related to the coherent bandwidth of the transmission channel. Because normally tap length, e.g. 128, is much smaller than the IFFT size, e.g. 2048, it is possible to reduce number of points used in the IFFT to a number a little larger than the tap length. Here, such a simplified IFFT method according to the invention is proposed.

Consider an IFFT filter to interpolate the channel sample while transforming the frequency signal into time domain. In this case, so long as the frequency spacing of the CTF samples is smaller than the channel coherent bandwidth, we do not need to know the channel information of any frequencies but the required number of CTF samples. Therefore, by omitting consideration of such frequencies, the IFFT size and hence hardware complexity can be reduced.

In an ISDB-T system, for example, the number of carriers $N_C$=1405, the carrier spacing is $1/T_S$ the number of IFFT points or IFFT size, $N_{IFFT}$=2048. The pilot symbols are inserted every 12 carriers, i.e. the pilot carrier spacing is $12/T_S$. Because the positions of the pilot symbols change periodically every 4 OFDM symbols, the pilot carrier spacing can be treated as $3/T_S$. Since the sampling interval of the incoming signal for FFT is $T_C$, the FIR filter tap interval should be $T_C$ too. Conventionally, after interpolation of $N_C$ carriers using estimation of pilot carriers, IFFT (1405,2048) is processed. Then the first 128 of 2048 IFFT output samples are extracted as tap coefficients of FIR filter. By contrast in the present invention we hope to reduce the IFFT computation quantity to 256 points, i.e. extracting the tap weights from a 256 IFFT output sequence. The symbol duration, $T_S$=2048$T_C$, while the duration of 256 IFFT samples, $T'_S$=256$T_C$=$T_S$/8. Over frequency domain, the CTF samples for simplified IFFT computation with the frequency spacing of $1/T'_S$ can be obtained through interpolation of the known pilot carriers. With the CTF samples of virtual $N_C/8 \cong 176$ carriers, IFFT (176,256) is processed.

Simulation and Results

We now present simulations of the embodiments discussed above, and comparisons with simulations of the known algorithms. In the simulations, signals from respective sections were handled as the complex base band signal of equivalent low-pass systems and the calculations was conducted in double precision real numbers. Frequency synchronization and clock timing are assumed to be ideal.

The relay station system is considered in a multipath time-invariant channel. In Table 1, the parameters used for simulating the coupling cancellation unit 9 in a two-path multipath channel are shown. The simulations shown in the figures assume that $C(\omega)$ is constant for all frequencies $\omega$.

TABLE 1

| Parameters of the SFN Repeater System Simulations | |
|---|---|
| Amplitude ratio of coupling wave: DU | 2 dB |
| Delay time of coupling wave wave: $\tau_c$ | 2.09 μs |
| Phase of coupling wave: $\theta_c$ | 45 degrees |
| Device noises of master station: C/$N_a$ | 40 dB |
| Relay station noise: C/$N_b$ | 40 dB |
| Delay time of multipath: $\tau_m$ | 0.984 μs |
| Phase of multipath: $\theta_m$ | 180 degrees |
| FIR filter tap length: M | 128 |

Let the received signal of the receiver be $\mu(i, k)$, and the decision value of the received signal $\mu(i, k)$ be $d(i, k)$, where k is the carrier number. Decision error signal err(i,k) is given as the following equation.

$$err(i,k)=d(i,k)-\mu(i,k) \quad (30)$$

The signal/noise ratio (SNR)$\Gamma_{SNR}(i)$ of ith symbol is defined as equation (26).

$$\Gamma_{SNR}(i) = 10 \log_{10} \left[ \frac{\sum_{k=0}^{K-1} d(i,k) \cdot d^*(i,k)}{\sum_{k=0}^{K-1} err(i,k) \cdot err^*(i,k)} \right] \quad (31)$$

The system performance evaluation is based on the SNR verse number of iteration.

Figure 6:
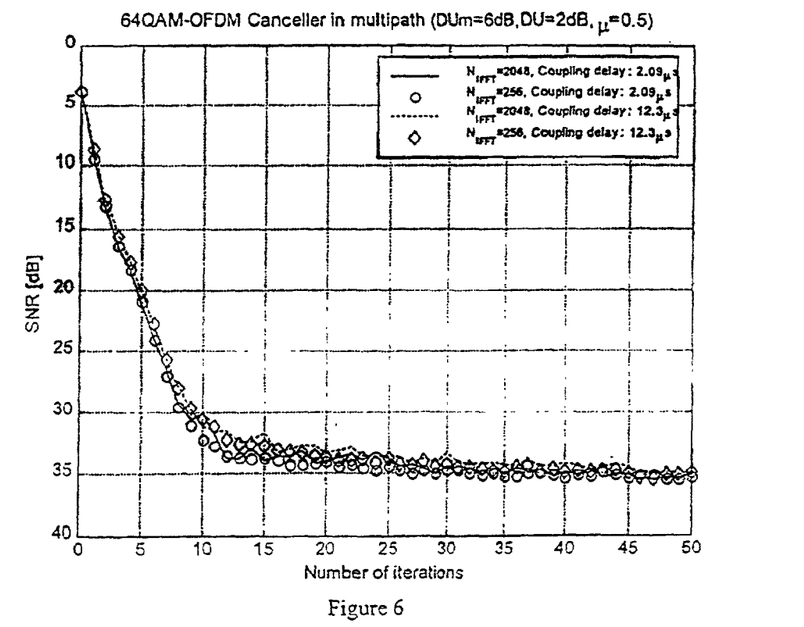
FIG. 6 shows simulated learning curves for a 64QAM-OFDM cancellation unit, using IFFT algorithms with 2048 points and 256 points respectively, for $DU_m$=6 dB, DU=2 dB, $\mu$=0.5 and two values for the coupling delay.

We will now explain the simplified IFFT used in the invention. FIG. 6 shows the computer simulation results of the 64QAM-OFDM coupling cancellation unit in a multipath channel with an IFFT size of 2048 points and 256 points for different coupling delay times. Obviously, the cancellation unit system performance can be maintained even if the IFFT size is reduced from 2048 to 256 provided that the delay time of the coupling waves is smaller than FIR filter tap length. This simulation is performed using a conventional cancellation unit, without CPE.

TABLE 2

| IFFT Computation Quantity | | |
|---|---|---|
| IFFT Size $N_{IFFT}$ | Multiplication $(N_{IFFT}/2)\log_2 N_{IFFT}$ | Addition $N_{IFFT}\log_2 N_{IFFT}$ |
| 2048 | 11264 | 22528 |
| 256 | 1024 | 2048 |

Table 2 shows the computation quantity of IFFT for 2048 points and 256 points, respectively. As can be seen, the number of computations required by the IFFT is reduced up to 10 times after changing IFFT size from 2048 to 256. That means the hardware complexity will be reduced greatly and processing speed will be accelerated. This method can also be applied to other receiver systems which use an IFFT transform e.g. decision feed back equalization.

We will now discuss the application of the invention to QAM Modulation with scattered pilot symbols. Table 3 shows the parameters used in the simulation of a 64QAM-OFDM modem.

TABLE 3

Parameters of OFDM Modem

| Modulation system | 64QAM-OFDM |
| --- | --- |
| Transmission bandwidth: BW | 5.575 . . . MHz |
| Total number of carriers: K | 1405/Symbol |
| Number of data carriers: Kd | 1287/Symbol |
| Pilot carrier, etc.: Kp | 118/Symbol |
| FFT size: $N_{FFT}$ | 2048 |
| FFT sample frequency: fs | 8.12693 . . . MHz |
| Effective symbol length: $T_s$ | 252 µs |
| Guard intervals: $T_g$ | 63 µs($T_s$/4) |
| SP interpolation carrier filter | Linear approximation |
| SP interpolation symbol filter | Same value interpolated within 4 symbols |
| Updating rate of FIR filter coefficient | 4 symbols/one updating |
| Error correction | None |

Figure 7:
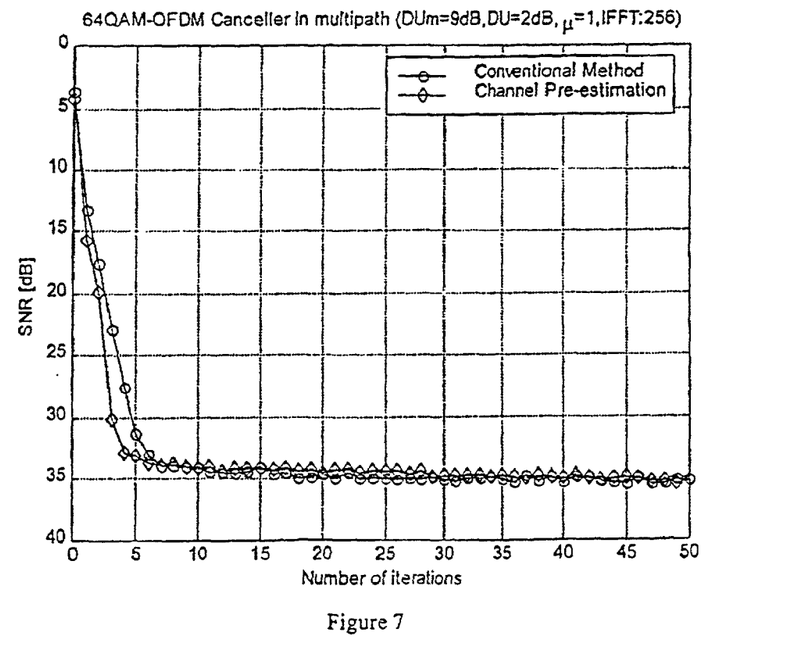
FIG. 7 shows simulated learning curves for a 64QAM-OFDM cancellation unit, with and without channel pre-estimation, for $DU_m$=9 dB, DU=2 dB, $\mu$=0.5, and IFFT of 256 points.
Figure 8:
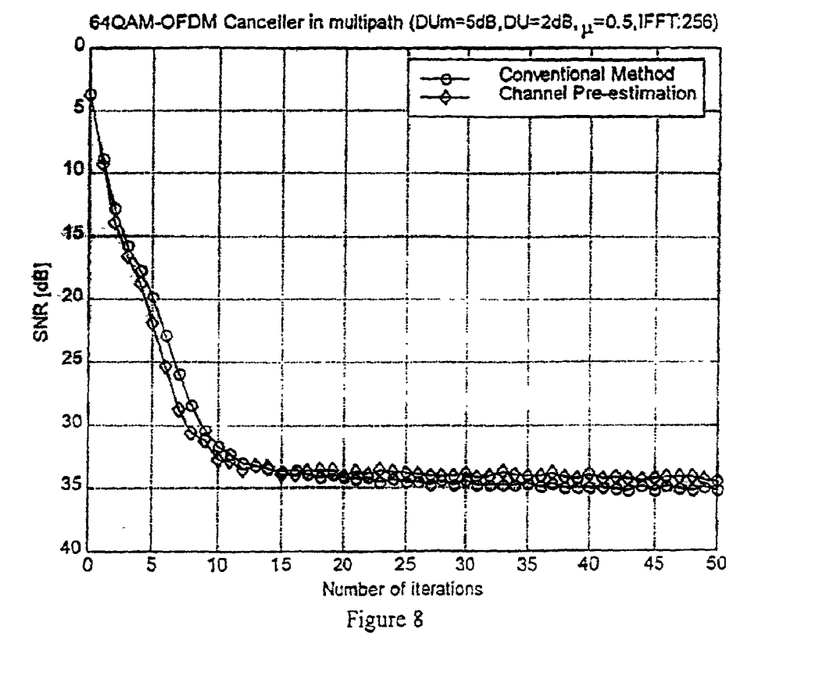
FIG. 8 shows simulated learning curves for a 64QAM-OFDM cancellation unit with and without channel pre-estimation for $DU_m$=5 dB, DU=2 dB, $\mu$=0.5, and IFFT of 256 points.

FIGS. 7 and 8 show the results of the computer simulation of the 64QAM-OFDM coupling cancellation unit convergence characteristics in a multipath channel using the conventional method and the new proposed method (referred to here as Channel Pre-Estimation, CPE) under the same channel condition which is the working limit of the cancellation unit which uses the conventional method. The simulation results show that the new method, CPE, accelerates the system convergence rate.

Figure 9:
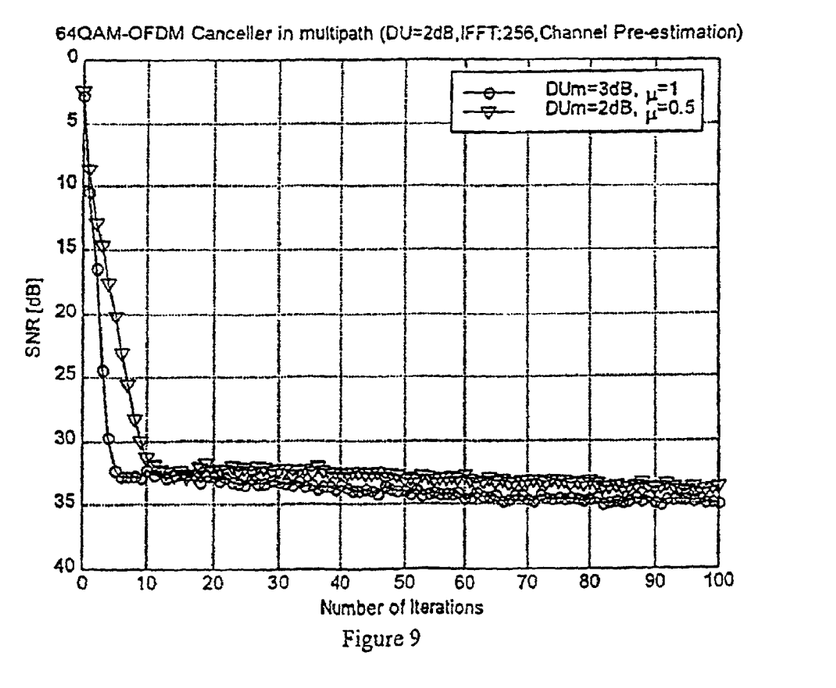
FIG. 9 shows simulated learning curves of a 64QAM-OFDM cancellation unit in a multipath channel with deep fading and channel pre-estimation.

FIG. 9 shows the system performance using new method under its working limit. It is shown that the new method can improve the system performance greatly. The cancellation unit using CPE can work well at $DU_m$=3 dB for µ=1 and $DU_m$=2 dB for µ=0.5, while conventional methods are only suitable for $DU_m$=9 dB and $DU_m$=5 dB respectively.

We turn now to the application of the invention to the case of differential modulation. Table 4 shows the parameters used in the simulation of DQPSK-OFDM modem.

Table 4

Parameters of OFDM Modem

| Modulation system | π/4 Shift DQPSK-OFDM |
| --- | --- |
| Transmission bandwidth: BW | 5.575 . . . MHz |
| Total number of carriers: K | 1405/Symbol |
| Number of data carriers: Kd | 1405/Symbol |
| FFT size: $N_{FFT}$ | 2048 |
| FFT sample frequency: fs | 8.12693 . . . MHz |
| Effective symbol length: Tu | 252 µs |
| Guard intervals: Tg | 63 µs(Tu/4) |
| Error correction | None |

Figure 10:
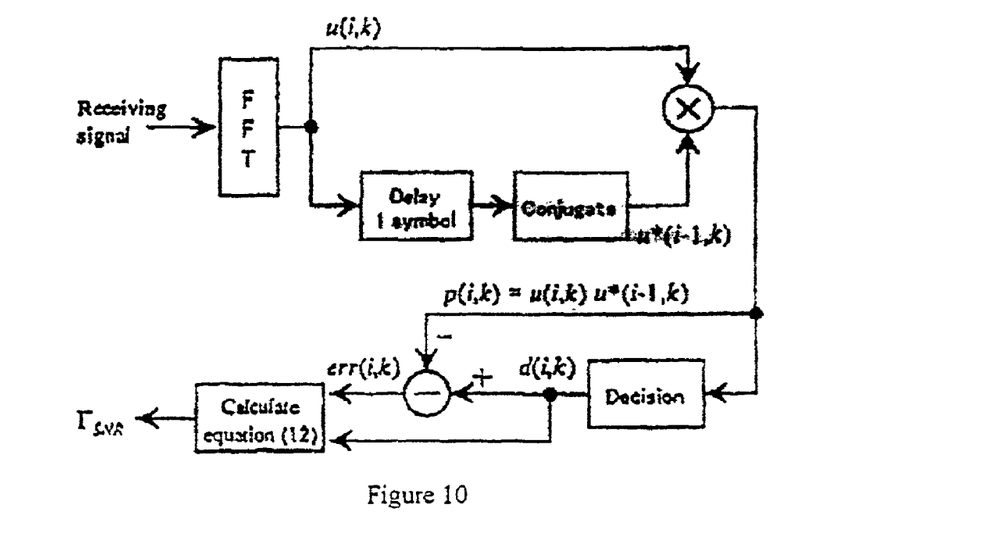
FIG. 10 shows the definition of the SN ratio at a receiver.

For assessing convergent characteristics, the signal-to-noise ratio of respective symbols of the receiver was used after delayed detection. FIG. 10 shows the block diagram of the method of calculating the signal/noise ratio $\Gamma_{SNR}$ at the receiver. The same definition as equation (31) determines the signal/noise ratio $\Gamma_{SNR}(i)$ for i-th symbol.

Figure 11:
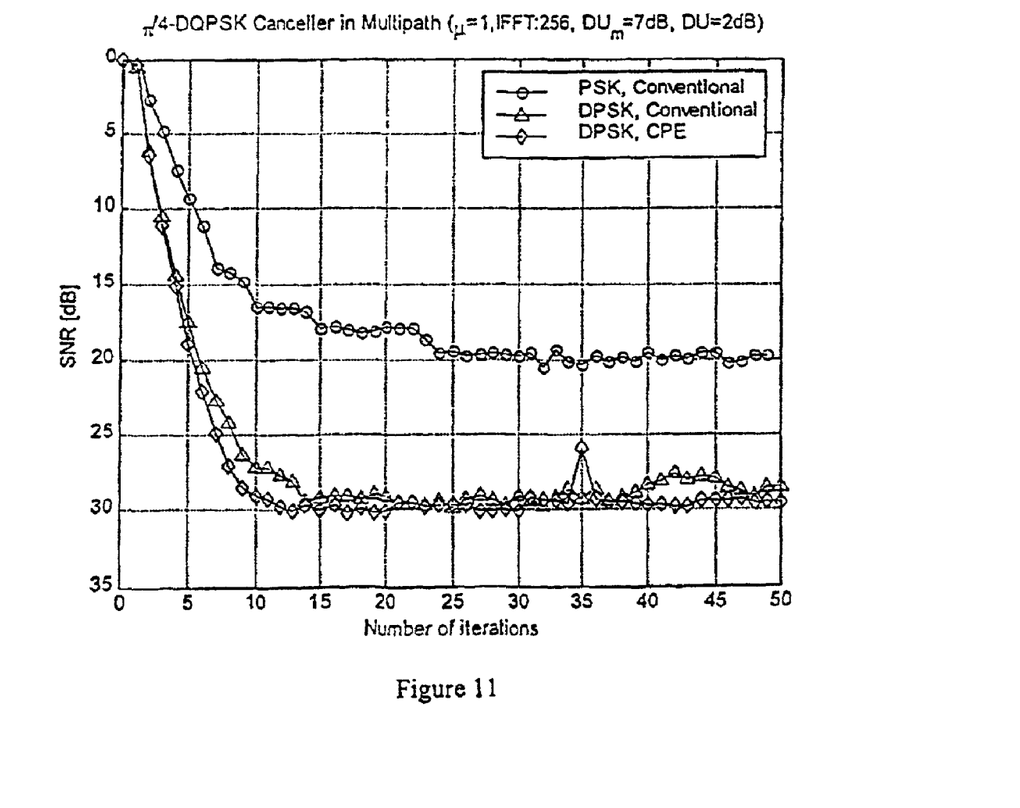
FIG. 11 shows simulated learning curves of a π/4-DQPSK-OFDM cancellation unit in a multipath channel with various algorithms for $DU_m$=7 dB, DU=2 dB, $\mu$=1, and IFFT of 256 points.
Figure 12:
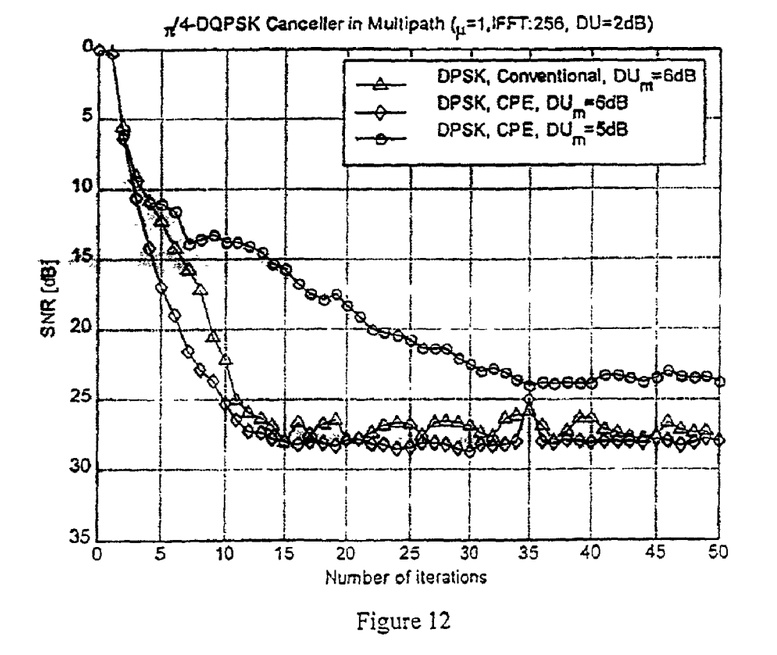
FIG. 12 shows simulated learning curves of a π/4-DQPSK-OFDM cancellation unit in a multipath channel with various algorithms for DU=2 dB, $\mu$=1, and IFFT of 256 points.
Figure 13:
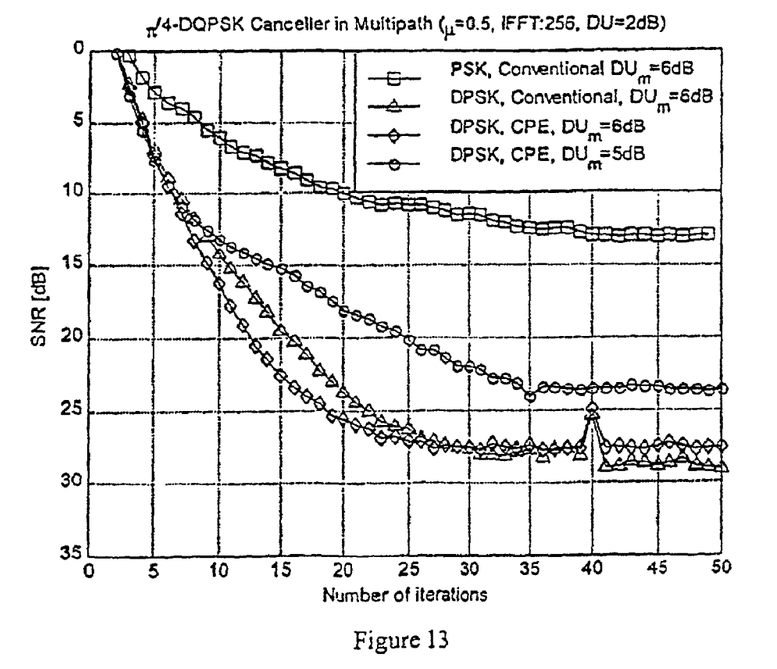
FIG. 13 shows simulated learning curves of a π/4-DQPSK-OFDM cancellation unit in a multipath channel with various algorithms for DU=2 dB, $\mu$=0.5, and IFFT of 256 points.

FIGS. 11, 12 and 13 show the result of computer simulations of convergence characteristics of a DQPSK-OFDM coupling cancellation unit.

The vertical axis represents mean SN ratio defined according to equation (31), and the horizontal axis is the number of iterations of the filter coefficients. Three cases are simulated:
1. Using the PSK method to estimate the desired signal plus the conventional algorithm to cancel echoes using Equation (9). Thus, the methods in this case are totally conventional.
2. Using the DPSK method to estimate the desired signal plus the conventional algorithm to cancel echoes using Equation (9).
3. Using the DPSK method to estimate the desired signal plus the Channel Pre-estimation (CPE) method to cancel echoes using Equation (15).

From FIGS. 11, 12 and 13, we can see that the DQPSK method is much better than the PSK method. This is because the conventional method cannot really estimate the desired signal in the multipath channel without a signal that consists of the channel phase. In addition, we can see that our most preferred method (case 3, which incorporates both of our proposed improvements) can achieve $DU_m$=5 dB and outperform the other methods. Note as $DU_m$ decreases, the system performance becomes worse.

In summary, the presently proposed method, Channel Pre-estimation (CPE), improves the system performance greatly and outperforms the conventional method. By using channel pre-estimation, the relay station can function in an environment which includes a multipath channel which has deep fading.

Moreover, the proposed simplified IFFT method reduces the required quantity of computations and hardware complexity. The simulation results show that these savings are made without reducing the performance of the system.

The invention claimed is:

1. A method of modifying the values of a plurality of digital filter coefficients which are used by a digital filter which is a component of a relay station, the relay station successively receiving a first signal, modifying the first signal using the digital filter to form a second signal, and transmitting the second signal with amplification, said first signal including a master signal subject to an interference and a coupling component derived from the second signal, the method comprising:
    (i) interrupting said transmission of the second signal;
    (ii) deriving an estimate of said interference and storing the derived interference estimate;
    (iii) resuming said transmission of the second signal; and
    (iv) modifying said digital filter coefficients using said stored interference estimate and said second signal, to reduce the difference between said second signal and said master signal.

2. A method according to claim 1 in which said step (iv) is repeated iteratively, whereby the difference between said second signal and said master signal is successively reduced.

3. A method according to claim 2 in which, upon performing each step (iv), a first parameter is derived characterizing the difference between said second signal and said master signal, and step (iv) is repeated until the value of said first parameter traverses a predefined convergence value.

4. A method according to claim 3 in which, upon said first parameter traversing said predefined convergence value, at least one step is performed, using said received signal but not using said stored interference estimate, of updating said digital filter coefficients to reduce the difference between said second signal and said master signal.

5. A method according to claim 3 in which, after said first parameter traverses the predefined convergence value, a second parameter characterizing the difference between the second signal and the master signal is repeatedly derived, and, upon said second parameter traversing a predefined divergence value, said steps (i) to (iv) are repeated.

6. A method according to claim 1 in which the relay station modifies the first signal by passing it through a coupling cancellation unit having an input receiving the first signal and an output outputting said second signal, and including said digital filter and a subtracter, the input of the coupling cancellation unit being an input to the subtracter and an output of the subtracter being passed to the output of the cancellation unit and to an input of the digital filter, the subtracter subtracting the output of the digital filter from the received signal.

7. A method according to claim 6 in which the output of the coupling cancellation unit includes a switch, the second signal being selectively transmitted via the switch to an amplifier which amplifies the second signal prior to transmission, said interruption of the transmission being performed by opening the switch.

8. A method according to claim 1 in which said step of modifying said digital filter coefficients includes: deriving a discrete Fourier transform of the second signal; employing said discrete Fourier transform of the second signal and a discrete Fourier transform of said estimated interference to derive correction values for said digital filter coefficients expressed in the frequency domain; and transforming said correction values into the time domain by an inverse Fourier transform operation, the digital filter coefficients being modified based on the time domain correction values.

9. A method according to claim 8 in which each of the digital coefficients of the digital filter modifies the first signal at pairwise time delay intervals $T_p$, the product of $T_p$ and the number of digital coefficients being substantially equal to a maximum delay time of a mulitpath interference component of the first signal.

10. A method according claim 9 in which the inverse Fourier transform generates a number of output tune domain values equal to or slightly larger than the number of digital coefficients.

11. A method according to claim 9 in which the inverse Fourier transform operates on a number of frequency domain values lower than the number of subcarriers used in practice.

12. A method according to claim 1 in which said master signal is in a format in which symbols are coded by differences between consecutive segments of the master signal, and said adjustment of the digital filter coefficients minimizes an estimated error in the estimation of differences between consecutive segments of the master signal.

13. A method according to claim 12 in which the format of the master signal encodes symbols by phase differences between consecutive segments.

14. A method of modifying the values of a plurality of digital filter coefficients for use by a digital filter which is a component of a relay station, the relay station successively receiving a first signal, modifying the first signal using the digital filter to form a second signal, and transmitting the second signal with amplification, said first signal including a master signal subject to an interference having a maximum delay time, each of the digital coefficients of the digital filter modifying the first signal at pairwise time delay intervals $T_p$, the method including:

deriving a discrete Fourier transform of the second signal;
employing said discrete Fourier transform of the second signal to derive correction values for said digital filter coefficients expressed in the frequency domain; and
transforming said correction values into the time domain by an inverse Fourier transform operation, the digital filter coefficients being modified based on the time domain correction values,
wherein:
the product of $T_p$ and the number of digital coefficients is substantially equal to the maximum delay time of the interference component of the first signal, and
the inverse Fourier transform generates a number of output time domain values equal to or slightly larger than the number of digital coefficients.

15. A method of modifying the values of a plurality of digital filter coefficients for use by a digital filter which is a component of a relay station, the relay station successively receiving a first signal, modifying the first signal using the digital filter to form a second signal, and transmitting the second signal with amplification, said first signal including a master signal and a coupling component, the master signal being in a format in which symbols are coded by differences between consecutive segments of the master signal, and the coupling component being derived from the second signal, the method comprising:

(i) deriving an estimate of differences between consecutive segments of the master signal;
(ii) estimating an error in said estimation of differences between consecutive segments of the master signal; and
(iii) modifying said digital filter coefficients to reduce said estimated error.

16. A coupling cancellation device for a relay station, the relay station receiving a first signal and transmitting it to a coupling cancellation device, receiving a second signal from the coupling cancellation device, transmitting the second signal to an amplifier and transmitting the amplified second signal, the coupling cancellation device including a digital filter based on a plurality of filter coefficients and arranged to generate a correction signal for combination with the first signal for reducing interference in the second signal, a digital signal processing unit which determines the filter coefficients, and a switch which selectively transmits the second signal to the amplifier of the relay station;
whereby the switch can be controlled not to transmit the second signal when it is desired to estimate multipath interference in the first signal.

17. A coupling cancellation device according to claim 16 in which the digital filter receives and the digital signal processing unit each receive said second signal, the coupling cancellation device further including a subtraction circuit receiving the correction signal from the digital filter and subtracting the correction signal from the first signal to generate the second signal.

18. A coupling cancellation device according to claim 17 in which the digital signal processing unit transforms the second signal into the frequency domain using a FFT to extract signals over pilot carriers for estimation of the channel transfer function, the digital signal processing unit including a switch for selectively transmitting the channel transfer function to a multipath interference estimation unit or to a digital filter coefficient determination unit.

19. A coupling cancellation device for a relay station, the relay station receiving a first signal and transmitting it to a coupling cancellation device, receiving a second signal from the coupling cancellation device, transmitting the second signal to an amplifier and transmitting the amplified second signal, the first signal being subject to an interference having a maximum delay time, the coupling cancellation device including:
a digital filter based on a plurality of filter coefficients and arranged to generate a correction signal for combination with the first signal for reducing interference in the second signal, each of the digital coefficients of the digital filter modifying the first signal at pairwise time delay intervals $T_p$, and
a digital signal processing unit which determines the filter coefficients by:
deriving a discrete Fourier transform of the second signal;
employing said discrete Fourier transform of the second signal to derive correction values for said digital filter coefficients expressed in the frequency domain; and
transforming said correction values into the time domain by an inverse Fourier transform operation, the digital filter coefficients being modified based on the time domain correction values, wherein:
the product of $T_p$ and the number of digital coefficients is substantially equal to the maximum delay time of the interference component of the first signal, and
the inverse Fourier transform generates a number of output time domain values equal to or slightly larger than the number of digital coefficients.

20. A coupling cancellation device for a relay station, the relay station receiving a first signal and transmitting it to a coupling cancellation device, receiving a second signal from the coupling cancellation device, transmitting the second signal to an amplifier and transmitting the amplified second signal, the master signal being in a format in which symbols are coded by differences between consecutive segments of the master signal, the coupling cancellation device including a digital filter based on a plurality of filter coefficients and arranged to generate a correction signal for combination with the first signal for reducing interference in the second signal, and a digital signal processing unit which determines the filter coefficients, the digital signal processing unit being arranged to derive an estimate of differences between consecutive segments of the master signal, estimate an error in said estimation of differences between consecutive segments of the master signal, and modify said digital filter coefficients to reduce said estimated error.

21. A relay station incorporating a coupling cancellation unit according to claim 16.

22. A relay station incorporating a coupling cancellation unit according to claim 19.

23. A relay station incorporating a coupling cancellation unit according to claim 20.

* * * * *